US009536971B2

(12) United States Patent
Juengling (10) Patent No.: US 9,536,971 B2
(45) Date of Patent: *Jan. 3, 2017

(54) SEMICONDUCTOR DEVICE COMPRISING A TRANSISTOR GATE HAVING MULTIPLE VERTICALLY ORIENTED SIDEWALLS

(71) Applicant: Micron Technology, Inc., Boise, ID (US)

(72) Inventor: Werner Juengling, Saratoga Springs, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/561,605

(22) Filed: Dec. 5, 2014

(65) Prior Publication Data

US 2015/0108566 A1   Apr. 23, 2015

Related U.S. Application Data

(60) Division of application No. 13/398,491, filed on Feb. 16, 2012, now Pat. No. 8,916,912, which is a
(Continued)

(51) Int. Cl.
*H01L 29/423* (2006.01)
*H01L 21/265* (2006.01)
(Continued)

(52) U.S. Cl.
CPC ..... *H01L 29/4236* (2013.01); *H01L 21/26586* (2013.01); *H01L 29/42368* (2013.01);
(Continued)

(58) Field of Classification Search
CPC ................... H01L 29/66795; H01L 29/66621; H01L 27/10876; H01L 27/10879; H01L 29/7851; H01L 27/11582; H01L 27/11556; H01L 29/66545; H01L 27/1157; H01L 27/11565

See application file for complete search history.

(56) References Cited

U.S. PATENT DOCUMENTS 4,455,740 A   6/1984   Iwai
4,722,910 A   2/1988   Yasaitis
(Continued)

FOREIGN PATENT DOCUMENTS

CN            1417853        5/2003
CN      201010274715.8       1/2013
(Continued)

OTHER PUBLICATIONS

Barth, "ITRS commodity memory roadmap", IEEE Xplore, Jun. 28, 2003, Abstract.
(Continued)

*Primary Examiner* — Tony Tran
(74) *Attorney, Agent, or Firm* — Wells St. John, P.S.

(57) ABSTRACT

A method used in fabrication of a recessed access device transistor gate has increased tolerance for mask misalignment. One embodiment of the invention comprises forming a vertical spacing layer over a semiconductor wafer, then etching the vertical spacing layer and the semiconductor wafer to form a recess in the wafer. A conductive transistor gate layer is then formed within the trench and over the vertical spacing layer. The transistor gate layer is etched, which exposes the vertical spacing layer. A spacer layer is formed over the etched conductive gate layer and over the vertical spacing layer, then the spacer layer and the vertical spacing layer are anisotropically etched. Subsequent to anisotropically etching the vertical spacing layer, a portion of the vertical spacing layer is interposed between the semiconductor wafer and the etched conductive transistor
(Continued)

gate layer in a direction perpendicular to the plane of a major surface of the semiconductor wafer.

3 Claims, 9 Drawing Sheets

Related U.S. Application Data continuation of application No. 11/863,535, filed on Sep. 28, 2007, now Pat. No. 8,399,920, which is a division of application No. 11/177,850, filed on Jul. 8, 2005, now Pat. No. 7,282,401.

(51) Int. Cl.
H01L 29/66 (2006.01)
H01L 29/78 (2006.01)

(52) U.S. Cl.
CPC .. *H01L 29/66621* (2013.01); *H01L 29/66659* (2013.01); *H01L 29/78* (2013.01); *H01L 29/7834* (2013.01)

(56) References Cited

U.S. PATENT DOCUMENTS

| | | |
|---|---|---|
| 4,835,741 A | 5/1989 | Baglee |
| 4,922,460 A | 5/1990 | Furutani et al. |
| 4,931,409 A | 6/1990 | Nakajima et al. |
| 4,937,641 A | 6/1990 | Sunami et al. |
| 4,939,100 A | 7/1990 | Jeuch et al. |
| 4,939,793 A | 7/1990 | Stewart |
| 4,979,004 A | 12/1990 | Esquivel et al. |
| 5,013,680 A | 5/1991 | Lowrey et al. |
| 5,014,110 A | 5/1991 | Satoh |
| 5,021,355 A | 6/1991 | Dhong et al. |
| 5,047,117 A | 9/1991 | Roberts |
| 5,107,459 A | 4/1992 | Chu et al. |
| 5,108,938 A | 4/1992 | Solomon |
| 5,122,848 A | 6/1992 | Lee et al. |
| 5,160,491 A | 11/1992 | Mori |
| 5,244,824 A | 9/1993 | Sivan |
| 5,254,218 A | 10/1993 | Roberts et al. |
| 5,281,548 A | 1/1994 | Prall |
| 5,358,879 A | 10/1994 | Brady et al. |
| 5,371,024 A | 12/1994 | Hieda et al. |
| 5,376,575 A | 12/1994 | Kim et al. |
| 5,392,237 A | 2/1995 | Lida |
| 5,413,949 A | 5/1995 | Hong |
| 5,446,299 A | 8/1995 | Acovic et al. |
| 5,472,893 A | 12/1995 | Lida |
| 5,480,838 A | 1/1996 | Mitsui |
| 5,496,751 A | 3/1996 | Wei et al. |
| 5,502,320 A | 3/1996 | Yamada et al. |
| 5,504,357 A | 4/1996 | Kim et al. |
| 5,512,770 A | 4/1996 | Hong |
| 5,514,604 A | 5/1996 | Brown |
| 5,532,089 A | 7/1996 | Adair et al. |
| 5,567,634 A | 10/1996 | Hebert |
| 5,573,837 A | 11/1996 | Roberts et al. |
| 5,574,621 A | 11/1996 | Sakamoto et al. |
| 5,612,559 A | 3/1997 | Park et al. |
| 5,619,057 A | 4/1997 | Komatsu |
| 5,687,119 A | 11/1997 | Park |
| 5,693,549 A | 12/1997 | Kim |
| 5,714,412 A | 2/1998 | Liang et al. |
| 5,714,786 A | 2/1998 | Gonzalez et al. |
| 5,739,066 A | 4/1998 | Pan |
| 5,753,947 A | 5/1998 | Gonzalez |
| 5,763,305 A | 6/1998 | Chao |
| 5,792,687 A | 8/1998 | Jeng |
| 5,792,690 A | 8/1998 | Sung |
| 5,798,544 A | 8/1998 | Ohya et al. |
| 5,817,552 A | 10/1998 | Roesner et al. |
| 5,841,611 A | 11/1998 | Sakakima et al. |
| 5,869,359 A | 2/1999 | Prabhakar |
| 5,869,382 A | 2/1999 | Kubota |
| 5,909,618 A | 6/1999 | Forbes et al. |
| 5,963,469 A | 10/1999 | Forbes |
| 5,964,750 A | 10/1999 | Tulleken et al. |
| 5,972,754 A | 10/1999 | Ni et al. |
| 5,977,579 A | 11/1999 | Noble |
| 6,005,273 A | 12/1999 | Gonzalez et al. |
| 6,015,990 A | 1/2000 | Hieda et al. |
| 6,033,963 A | 3/2000 | Huang et al. |
| 6,037,212 A | 3/2000 | Chao |
| 6,054,355 A | 4/2000 | Inumiya et al. |
| 6,059,553 A | 5/2000 | Jin et al. |
| 6,063,669 A | 5/2000 | Takaishi |
| 6,072,209 A | 6/2000 | Noble et al. |
| 6,090,693 A | 7/2000 | Gonzalez et al. |
| 6,090,700 A | 7/2000 | Tseng |
| 6,096,596 A | 8/2000 | Gonzalez |
| 6,108,191 A | 8/2000 | Bruchhaus et al. |
| 6,114,735 A | 9/2000 | Batra et al. |
| 6,120,952 A | 9/2000 | Pierrat et al. |
| 6,124,611 A | 9/2000 | Mori |
| 6,127,699 A | 10/2000 | Ni et al. |
| 6,150,687 A | 11/2000 | Noble et al. |
| 6,168,996 B1 | 1/2001 | Numazawa et al. |
| 6,184,086 B1 | 2/2001 | Kao |
| 6,187,643 B1 | 2/2001 | Borland |
| 6,191,470 B1 | 2/2001 | Forbes et al. |
| 6,214,670 B1 | 4/2001 | Shih et al. |
| 6,215,149 B1 | 4/2001 | Lee et al. |
| 6,225,669 B1 | 5/2001 | Long et al. |
| 6,255,165 B1 | 7/2001 | Thurgate et al. |
| 6,258,650 B1 | 7/2001 | Sunouchi |
| 6,259,142 B1 | 7/2001 | Dawson et al. |
| 6,274,497 B1 | 8/2001 | Lou |
| 6,284,419 B2 | 9/2001 | Pierrat et al. |
| 6,297,106 B1 | 10/2001 | Pan et al. |
| 6,300,177 B1 | 10/2001 | Sundaresan et al. |
| 6,303,518 B1 | 10/2001 | Tian et al. |
| 6,306,755 B1 | 10/2001 | Zheng et al. |
| 6,319,644 B2 | 11/2001 | Pierrat et al. |
| 6,323,506 B1 | 11/2001 | Alok |
| 6,323,528 B1 | 11/2001 | Yamazaki et al. |
| 6,331,461 B1 | 12/2001 | Juengling |
| 6,337,497 B1 | 1/2002 | Hanafi et al. |
| 6,340,614 B1 | 1/2002 | Tseng |
| 6,348,385 B1 | 2/2002 | Cha et al. |
| 6,349,052 B1 | 2/2002 | Hofmann et al. |
| 6,362,506 B1 | 3/2002 | Miyai |
| 6,372,554 B1 | 4/2002 | Kawakita et al. |
| 6,383,861 B1 | 5/2002 | Gonzalez et al. |
| 6,383,879 B1 | 5/2002 | Kizilyalli et al. |
| 6,391,726 B1 | 5/2002 | Manning |
| 6,399,490 B1 | 6/2002 | Jammy et al. |
| 6,414,356 B1 | 7/2002 | Forbes et al. |
| 6,417,085 B1 | 7/2002 | Batra et al. |
| 6,420,786 B1 | 7/2002 | Gonzalez et al. |
| 6,458,653 B1 | 10/2002 | Jang |
| 6,458,925 B1 | 10/2002 | Fasano |
| 6,459,138 B2 | 10/2002 | Reinberg |
| 6,459,142 B1 | 10/2002 | Tihanyi |
| 6,473,333 B1 | 10/2002 | Tachibana et al. |
| 6,476,444 B1 | 11/2002 | Min |
| 6,495,474 B1 | 12/2002 | Rafferty et al. |
| 6,495,890 B1 | 12/2002 | Ono |
| 6,498,062 B2 | 12/2002 | Durcan et al. |
| 6,498,087 B2 | 12/2002 | French et al. |
| 6,552,401 B1 | 4/2003 | Dennison |
| 6,563,183 B1 | 5/2003 | En et al. |
| 6,566,193 B2 | 5/2003 | Hofmann et al. |
| 6,573,559 B2 | 6/2003 | Kitada et al. |
| 6,586,808 B1 | 7/2003 | Xiang et al. |
| 6,624,032 B2 | 9/2003 | Alavi et al. |
| 6,630,720 B1 | 10/2003 | Maszara et al. |
| 6,632,714 B2 | 10/2003 | Yoshikawa |
| 6,632,723 B2 | 10/2003 | Watanabe et al. |
| 6,645,818 B1 | 11/2003 | Sing et al. |
| 6,645,869 B1 | 11/2003 | Chu et al. |
| 6,656,748 B2 | 12/2003 | Hall et al. |

(56) References Cited

U.S. PATENT DOCUMENTS

| | | | |
|---|---|---|---|
| 6,686,616 B1 * | 2/2004 | Allen et al. ............... 257/280 |
| 6,696,746 B1 | 2/2004 | Farrar et al. |
| 6,706,600 B2 | 3/2004 | Kanaya |
| 6,707,706 B2 | 3/2004 | Nitayama et al. |
| 6,717,200 B1 | 4/2004 | Schamberger et al. |
| 6,720,232 B1 | 4/2004 | Tu et al. |
| 6,724,028 B2 | 4/2004 | Gudesen |
| 6,727,137 B2 | 4/2004 | Brown |
| 6,744,097 B2 | 6/2004 | Yoo |
| 6,753,228 B2 | 6/2004 | Azam et al. |
| 6,767,789 B1 | 7/2004 | Bronner et al. |
| 6,784,112 B2 | 8/2004 | Arita et al. |
| 6,818,515 B1 | 11/2004 | Lee et al. |
| 6,818,937 B2 | 11/2004 | Noble et al. |
| 6,818,947 B2 | 11/2004 | Grebs et al. |
| 6,822,261 B2 | 11/2004 | Yamazaki et al. |
| 6,825,093 B2 | 11/2004 | Scholz |
| 6,844,230 B2 | 1/2005 | Reinberg |
| 6,844,591 B1 | 1/2005 | Tran |
| 6,849,496 B2 | 2/2005 | Jaiprakash et al. |
| 6,849,501 B2 | 2/2005 | Rudeck |
| 6,864,536 B2 | 3/2005 | Lin et al. |
| 6,888,198 B1 | 5/2005 | Krivokapic |
| 6,888,770 B2 | 5/2005 | Ikehashi |
| 6,897,109 B2 | 5/2005 | Jin et al. |
| 6,916,711 B2 | 7/2005 | Yoo |
| 6,924,190 B2 | 8/2005 | Dennison |
| 6,930,640 B2 | 8/2005 | Chung et al. |
| 6,939,763 B2 | 9/2005 | Schlosser et al. |
| 6,969,662 B2 | 11/2005 | Fazan et al. |
| 6,979,853 B2 | 12/2005 | Sommer et al. |
| 7,005,349 B2 | 2/2006 | Lee et al. |
| 7,005,710 B1 | 2/2006 | Gonzalez et al. |
| 7,015,543 B2 | 3/2006 | Kawamura et al. |
| 7,022,573 B2 | 4/2006 | Hsiao et al. |
| 7,027,334 B2 | 4/2006 | Ikehashi |
| 7,030,436 B2 | 4/2006 | Forbes |
| 7,042,009 B2 | 5/2006 | Shaheen et al. |
| 7,049,196 B2 | 5/2006 | Noble |
| 7,064,365 B2 | 6/2006 | An et al. |
| 7,071,043 B2 | 7/2006 | Tang et al. |
| 7,075,151 B2 | 7/2006 | Shino |
| 7,084,028 B2 | 8/2006 | Fukuzumi |
| 7,087,956 B2 | 8/2006 | Umebayashi |
| 7,091,092 B2 | 8/2006 | Sneelal et al. |
| 7,122,425 B2 | 10/2006 | Chance et al. |
| 7,122,449 B2 | 10/2006 | Langdo et al. |
| 7,125,774 B2 | 10/2006 | Kim et al. |
| 7,125,781 B2 | 10/2006 | Manning et al. |
| 7,135,371 B2 | 11/2006 | Han et al. |
| 7,148,527 B2 | 12/2006 | Kim et al. |
| 7,160,788 B2 | 1/2007 | Sandhu et al. |
| 7,179,706 B2 | 2/2007 | Patraw et al. |
| 7,199,005 B2 | 4/2007 | Sandhu et al. |
| 7,202,127 B2 | 4/2007 | Busch et al. |
| 7,214,621 B2 | 5/2007 | Nejad et al. |
| 7,244,659 B2 | 7/2007 | Tang et al. |
| 7,250,650 B2 | 7/2007 | Hieriemann et al. |
| 7,262,089 B2 | 8/2007 | Abbott et al. |
| 7,282,401 B2 | 10/2007 | Juengling |
| 7,285,812 B2 | 10/2007 | Tang et al. |
| 7,319,255 B2 | 1/2008 | Hwang et al. |
| 7,349,232 B2 | 3/2008 | Wang et al. |
| 7,351,666 B2 | 4/2008 | Furukawa et al. |
| 7,361,545 B2 | 4/2008 | Li et al. |
| 7,361,569 B2 | 4/2008 | Tran et al. |
| 7,384,849 B2 | 6/2008 | Parekh et al. |
| 7,390,746 B2 | 6/2008 | Bai et al. |
| 7,393,789 B2 | 7/2008 | Abatchev et al. |
| 7,396,781 B2 | 7/2008 | Wells |
| 7,413,981 B2 | 8/2008 | Tang et al. |
| 7,429,536 B2 | 9/2008 | Abatchev et al. |
| 7,435,536 B2 | 10/2008 | Sandhu et al. |
| 7,455,956 B2 | 11/2008 | Sandhu et al. |
| 7,465,616 B2 | 12/2008 | Tang et al. |
| 7,488,685 B2 | 2/2009 | Kewley |
| 7,494,870 B2 | 2/2009 | Chien et al. |
| 7,495,294 B2 | 2/2009 | Higashitani |
| 7,495,946 B2 | 2/2009 | Schwerin et al. |
| 7,504,686 B2 | 3/2009 | Lutze et al. |
| 7,528,440 B2 | 5/2009 | Forbes |
| 7,535,745 B2 | 5/2009 | Shuto |
| 7,547,640 B2 | 6/2009 | Abatchev et al. |
| 7,547,945 B2 | 6/2009 | Tang et al. |
| 7,560,390 B2 | 7/2009 | Sant et al. |
| 7,564,087 B2 | 7/2009 | Forbes |
| 7,567,087 B2 | 7/2009 | Forbes |
| 7,567,452 B2 | 7/2009 | Song et al. |
| 7,576,389 B2 | 8/2009 | Tanaka |
| 7,589,995 B2 | 9/2009 | Tang et al. |
| 7,602,001 B2 | 10/2009 | Gonzalez |
| 7,605,090 B2 | 10/2009 | Gutsche et al. |
| 7,608,503 B2 | 10/2009 | Lung et al. |
| 7,608,876 B2 | 10/2009 | Forbes |
| 7,619,311 B2 | 11/2009 | Lung |
| 7,648,919 B2 | 1/2010 | Tran et al. |
| 7,684,245 B2 | 3/2010 | Schumann et al. |
| 7,700,441 B2 | 4/2010 | Kim et al. |
| 7,732,275 B2 | 6/2010 | Orimoto et al. |
| 7,736,980 B2 | 6/2010 | Juengling |
| 7,755,132 B2 | 7/2010 | Mokhlesi |
| 7,759,193 B2 | 7/2010 | Fishburn |
| 7,902,028 B2 | 3/2011 | Kim et al. |
| 8,084,190 B2 | 12/2011 | Gutsche et al. |
| 8,426,273 B2 | 4/2013 | Hanson et al. |
| 2001/0002304 A1 | 5/2001 | Pierrat et al. |
| 2001/0017390 A1 | 8/2001 | Long et al. |
| 2001/0023045 A1 | 9/2001 | Pierrat et al. |
| 2001/0025973 A1 | 10/2001 | Yamada et al. |
| 2001/0038123 A1 | 11/2001 | Yu |
| 2001/0044181 A1 | 11/2001 | Nakamura |
| 2001/0052617 A1 | 12/2001 | Kitada et al. |
| 2002/0022339 A1 | 2/2002 | Kirchoff |
| 2002/0127796 A1 | 9/2002 | Hofmann et al. |
| 2002/0127798 A1 | 9/2002 | Prall |
| 2002/0130378 A1 | 9/2002 | Forbes et al. |
| 2002/0135030 A1 | 9/2002 | Horikawa |
| 2002/0153579 A1 | 10/2002 | Yamamoto |
| 2002/0163039 A1 | 11/2002 | Cleventer et al. |
| 2002/0192911 A1 | 12/2002 | Parke |
| 2003/0001290 A1 | 1/2003 | Nitayama et al. |
| 2003/0011032 A1 | 1/2003 | Umebayashi |
| 2003/0042512 A1 | 3/2003 | Gonzalez |
| 2003/0082863 A1 | 5/2003 | Lim et al. |
| 2003/0092238 A1 | 5/2003 | Eriguchi |
| 2003/0094651 A1 | 5/2003 | Suh |
| 2003/0161201 A1 | 8/2003 | Sommer et al. |
| 2003/0164527 A1 | 9/2003 | Sugi et al. |
| 2003/0168677 A1 | 9/2003 | Hsu |
| 2003/0169629 A1 | 9/2003 | Goebel et al. |
| 2003/0170941 A1 | 9/2003 | Colavito |
| 2003/0170955 A1 | 9/2003 | Kawamura et al. |
| 2003/0234414 A1 | 12/2003 | Brown |
| 2004/0009644 A1 | 1/2004 | Suzuki |
| 2004/0018679 A1 | 1/2004 | Suzuki |
| 2004/0034587 A1 | 2/2004 | Amberson et al. |
| 2004/0061148 A1 | 4/2004 | Hsu |
| 2004/0065919 A1 | 4/2004 | Wilson et al. |
| 2004/0070028 A1 | 4/2004 | Azam et al. |
| 2004/0092115 A1 | 5/2004 | Hsieh et al. |
| 2004/0125636 A1 | 7/2004 | Kurjanowicz et al. |
| 2004/0150070 A1 | 8/2004 | Okada et al. |
| 2004/0159857 A1 | 8/2004 | Horita et al. |
| 2004/0184298 A1 | 9/2004 | Takahashi et al. |
| 2004/0188738 A1 | 9/2004 | Farnworth et al. |
| 2004/0197995 A1 | 10/2004 | Lee et al. |
| 2004/0222458 A1 | 11/2004 | Hsieh et al. |
| 2004/0224476 A1 | 11/2004 | Yamada et al. |
| 2004/0232466 A1 | 11/2004 | Birner et al. |
| 2004/0259311 A1 | 12/2004 | Kim et al. |
| 2004/0266081 A1 | 12/2004 | Oh et al. |
| 2005/0017240 A1 | 1/2005 | Fazan |
| 2005/0042833 A1 | 2/2005 | Park et al. |
| 2005/0063224 A1 | 3/2005 | Fazan et al. |

(56) References Cited

U.S. PATENT DOCUMENTS

| | | |
|---|---|---|
| 2005/0066892 A1 | 3/2005 | Dip et al. |
| 2005/0104156 A1 | 5/2005 | Wasshuber |
| 2005/0106820 A1 | 5/2005 | Tran |
| 2005/0106838 A1 | 5/2005 | Lim et al. |
| 2005/0124130 A1 | 6/2005 | Mathew et al. |
| 2005/0136616 A1 | 6/2005 | Cho et al. |
| 2005/0158949 A1 | 7/2005 | Cho et al. |
| 2005/0167751 A1 | 8/2005 | Nakajima et al. |
| 2005/0275014 A1 | 12/2005 | Kim |
| 2005/0275042 A1 | 12/2005 | Hwang et al. |
| 2005/0287780 A1 | 12/2005 | Manning et al. |
| 2006/0043449 A1 | 3/2006 | Tang et al. |
| 2006/0046407 A1 | 3/2006 | Juengling |
| 2006/0046424 A1 | 3/2006 | Chance et al. |
| 2006/0083058 A1 | 4/2006 | Ohsawa |
| 2006/0113588 A1 | 6/2006 | Wu |
| 2006/0167741 A1 | 7/2006 | Ramachandra |
| 2006/0194410 A1 | 8/2006 | Sugaya |
| 2006/0204898 A1 | 9/2006 | Gutsche et al. |
| 2006/0216894 A1 | 9/2006 | Parekh et al. |
| 2006/0216922 A1 | 9/2006 | Tran et al. |
| 2006/0261393 A1 | 11/2006 | Tang et al. |
| 2006/0264001 A1 | 11/2006 | Tran et al. |
| 2006/0281254 A1 | 12/2006 | Lee et al. |
| 2007/0001222 A1 | 1/2007 | Orlowski et al. |
| 2007/0045712 A1 | 3/2007 | Haller et al. |
| 2007/0048941 A1 | 3/2007 | Tang et al. |
| 2007/0048942 A1 | 3/2007 | Hanson et al. |
| 2007/0051997 A1 | 3/2007 | Haller et al. |
| 2007/0096204 A1 | 5/2007 | Shiratake |
| 2007/0117310 A1 | 5/2007 | Bai et al. |
| 2007/0128856 A1 | 6/2007 | Tran et al. |
| 2007/0138526 A1 | 6/2007 | Tran et al. |
| 2007/0148984 A1 | 6/2007 | Abatchev et al. |
| 2007/0158719 A1 | 7/2007 | Wang |
| 2007/0166920 A1 | 7/2007 | Tang et al. |
| 2007/0178641 A1 | 8/2007 | Kim et al. |
| 2007/0238299 A1 | 10/2007 | Niroomand et al. |
| 2007/0238308 A1 | 10/2007 | Niroomand et al. |
| 2007/0261016 A1 | 11/2007 | Sandhu et al. |
| 2008/0012056 A1 | 1/2008 | Gonzalez |
| 2008/0012070 A1 | 1/2008 | Juengling |
| 2008/0042179 A1 | 2/2008 | Haller et al. |
| 2008/0061346 A1 | 3/2008 | Tang et al. |
| 2008/0099847 A1 | 5/2008 | Tang et al. |
| 2008/0142882 A1 | 6/2008 | Tang et al. |
| 2008/0166856 A1 | 7/2008 | Parekh et al. |
| 2008/0299774 A1 | 12/2008 | Sandhu et al. |
| 2008/0311719 A1 | 12/2008 | Tang et al. |
| 2009/0035665 A1 | 2/2009 | Tran |
| 2009/0173994 A1 | 7/2009 | Tran |
| 2009/0311845 A1 | 12/2009 | Tang et al. |
| 2010/0006983 A1 | 1/2010 | Gutsche et al. |
| 2012/0009772 A1 | 1/2012 | Mathew et al. |

FOREIGN PATENT DOCUMENTS

| | | |
|---|---|---|
| DE | 04408764 | 9/1994 |
| DE | 19928781 | 7/2000 |
| EP | 0453998 | 10/1991 |
| EP | 1003219 | 5/2000 |
| EP | 1067597 | 1/2001 |
| EP | 1089344 | 4/2001 |
| EP | 1271632 | 1/2003 |
| EP | 1391939 | 2/2004 |
| EP | 1696477 | 9/2009 |
| EP | 1125167 | 5/2010 |
| EP | 100114743 | 7/2011 |
| EP | 14001506 | 11/2014 |
| JP | 51-147280 | 12/1976 |
| JP | 58-220464 | 12/1983 |
| JP | 2002172 | 1/1990 |
| JP | 03-219677 | 9/1991 |
| JP | H04-14253 | 1/1992 |
| JP | 07-078977 | 3/1995 |
| JP | 07-106435 | 4/1995 |
| JP | 07-297297 | 11/1995 |
| JP | 09-129837 | 5/1997 |
| JP | 11-274478 | 10/1999 |
| JP | 2000-208762 | 7/2000 |
| JP | 2001-024161 | 1/2001 |
| JP | 2002-151654 | 5/2002 |
| JP | 2002-184958 | 6/2002 |
| JP | 2003-017585 | 1/2003 |
| JP | 2004-071935 | 3/2004 |
| JP | 2004-0247656 | 9/2004 |
| JP | 2005-142203 | 6/2005 |
| JP | 2005-175090 | 6/2005 |
| JP | 2005-277430 | 6/2005 |
| JP | 2005-093808 | 7/2005 |
| JP | 2005-354069 | 12/2005 |
| KR | 19930006930 | 4/1993 |
| KR | 19940006679 | 4/1994 |
| KR | 10-2004-0109280 | 10/2006 |
| KR | 10-0640616 | 10/2006 |
| TW | 498332 | 8/2002 |
| TW | 574746 | 2/2004 |
| TW | 428308 | 4/2004 |
| TW | 200411832 | 7/2004 |
| TW | I231042 | 4/2005 |
| TW | I235479 | 7/2005 |
| TW | 200617957 | 6/2006 |
| TW | 096128462 | 6/2011 |
| WO | WO 86/03341 | 6/1986 |
| WO | WO 97/44826 | 11/1997 |
| WO | WO 99/36961 | 7/1999 |
| WO | WO 00/19272 | 4/2000 |
| WO | WO 02/089182 | 11/2002 |
| WO | PCT/US2004/027898 | 2/2005 |
| WO | WO 2005/024936 | 3/2005 |
| WO | WO 2005/083770 | 9/2005 |
| WO | PCT/US2006/006806 | 7/2006 |
| WO | PCT/US2006/008295 | 7/2006 |
| WO | PCT/US2006/008295 | 9/2006 |
| WO | PCT/US2004/034587 | 10/2006 |
| WO | PCT/US2005/030668 | 10/2006 |
| WO | PCT/US2006/031555 | 12/2006 |
| WO | PCT/US2006/006806 | 2/2007 |
| WO | PCT/US2006/008295 | 5/2007 |
| WO | WO 2007/058840 | 5/2007 |
| WO | PCT/US2006/006806 | 9/2007 |
| WO | PCT/US2007/001953 | 9/2007 |
| WO | PCT/US2007/014689 | 1/2008 |
| WO | PCT/US2007/016573 | 1/2008 |
| WO | PCT/US2007/014689 | 4/2008 |
| WO | PCT/US2007/023767 | 5/2008 |
| WO | PCT/US2007/001953 | 8/2008 |
| WO | PCT/US2007/019592 | 11/2008 |
| WO | PCT/US2007/014689 | 1/2009 |
| WO | PCT/US2007/016573 | 2/2009 |
| WO | PCT/US2007/019592 | 3/2009 |
| WO | PCT/US2007/023767 | 5/2009 |
| WO | PCT/US2006/031555 | 10/2011 |

OTHER PUBLICATIONS

Bashir et al., "Characterization of sidewall defects in selective epitaxial growth of silicon", American Vacuum Society, May/Jun. 1995, pp. 923-927.

Bashir et al., "Reduction of sidewall defect induced leakage currents by the use of nitrided field oxides in silicon selective epitaxial growth isolation for advanced ultralarge scale integration", American Vacuum Society, Mar./Apr. 2000, pp. 695-699.

Bernstein et al., Chapter 3, 3.4-3.5, SOI Device Electrical Properties, Jan. 2000; pp. 34-53.

Bhave, et al., "Developer-soluble Gap fill materials for patterning metal trenches in Via-first Dual Damascene process", 2004 Society of Photo-Optical Instrumentation Engineers, Proceedings of SPIE: Advances in Resist Technology and Processing XXI, vol. 5376, 2004.

Chen et al., "The Enhancement of Gate-Induced-Drain-Leakage (GIDL) Current in Short-Channel SOI MOSFET and its Application (56) References Cited

OTHER PUBLICATIONS in . . . ", IEEE Electron Device Letters, vol. 13, No. 11, pp. 572-574 (Nov. 1992).
Choi et al., "Investigation of Gate-Induced Drain Leakage (GIDL) Current in Thin Body Devices: Single-Gate Ultra-thin Body, Symmetrical Double-Gate, and . . . ", Jpn. J. Appl. Phys., vol. 42, pp. 2073-2076 (2003).
Clarke, "Device Structures Architectures compatible with conventional silicon processes—Vertical transistors plumbed for memory, logic", Electronic Engineering Times, p. 24, Feb. 14, 2000.
Fazan et al., "MOSFET design simplifies DRAM", EE Times, May 13, 2002, 7 pgs.
Gonzalez et al., "A dynamic source-drain extension MOSFET using a separately biased conductive spacer", Solid-State Electronics, vol. 46, pp. 1525-1530 (2002).
Hammad et al., "The Pseudo-Two-Dimensional Approach to Model the Drain Section in SOI MOSFETs", 2001 IEEE Transactions on Electron Devices, vol. 48, No. 2, Feb. 2001, pp. 386-387.
Hara, "Toshiba cuts capacitor from DRAM cell design", EE Times, http://www.us.design-reuse.com/news/news24,html, Feb. 7, 2002, 2 pgs.
Henkels et al., "Large-Signal 2T, 1C DRAM Cell: Signal and Layout Analysis", 1994 IEEE Journal of Solid-State Circuits, Jul. 29, 1994, No. 7, pp. 829-832.
Keast, et al., "Silicon Contact Formation and Photoresist Planarization Using Chemical Mechanical Polishing", 1994 ISMIC, Jun. 7-8, 1994 VMIC Conference, pp. 204-205.
Kim et al., "The Breakthrough in data retention time of DRAM using Recess-Channel-Array Transistor (RCAT) for 88nm feature size and beyond", 2003 Symposium on VLSI Technology Digest of Technical Papers, 2 pages.
Kim H.S. et al., "An Outstanding and Highly Manufacturable 80nm DRAM Technology", 2003 IEEE, 4 pages.
Kraynik, "Foam Structure: from soap froth to solid foams", MRS Bulletin, Apr. 2003, pp. 275-278.
Kuo et al., "A capacitorless double-gate DRAM cell design for high density applications", IEEE, IEDM, pp. 843-846 (2002).
Lammers, "Bell Labs opens gate to deeper-submicron CMOS", Electronic Engineering Times, Dec. 6, 1999, p. 18.
Liu, "Dual-Work-Function Metal Gates by Full Silicidation of Poly-Si with Co—Ni Bi-Layers", 2005 IEEE, vol. 26, No. 4, Apr. 2005, pp. 228-230.
Lusky et al., "Investigation of channel hot electron injection by localized charge-trapping nonvolatile memory devices", IEEE Transactions on Electron Devices, vol. 51, No. 3, pp. 444-451 (Mar. 2004).
Maeda et al., "Impact of a Vertical Pi-Shape Transistor (VPiT) Cell for 1 Gbit DRAM and Beyond", IEEE Transactions on Electron Devices Dec. 1995, No. 12, pp. 2117-2124.
Minami et al., "A Floating Body Cell (FBC) Fully Compatible with 90 nm CMOS Technology (CMOS4) for 128Mb SOI DRAM", 2005 IEDM Technical Program, 2005, pp. 13.1.1-13.1.4.
Minami et al., "A high speed and high reliability MOSFET utilizing an auxiliary gate", 1990 Symposium on VLSI Technology, IEEE, pp. 41-42 (1990).
Mo et al., "Formation and Properties of ternary silicide (CoxNi1-x) Si2 thin films", 1998 IEEE, pp. 271-274.
Ranica et al., "A One Transistor Cell on Bulk Substrate (IT-Bulk) for Low-Cost & High Density eDRAM", VLSI Technology, 2004, IEEE, (Jun. 15, 2004), pp. 128-129.
Risch et al., "Vertical MOS Transistors wtih 70nm Channel Length", 1996 IEEE vol. 43, No. 9, Sep. 1996, pp. 1495-1498.
Sivagnaname et al., "Stand-by Current in PD-SOI Pseudo-nMOS Circuits", 2003 IEEE, pp. 95-96.
Sunouchi et al., "Double LDD concave (DLC) structure for sub-half Micron MOSFET", IEEE, IEDM, pp. 226-228 (1988).
Tanaka et al., "Scalability study on a capacitorless 1T-DRAM: from single-gate PD-SOI to double-gate FinDRAM", IEDM Technical Digest, IEEE International Electron Devices Meeting, Dec. 13-15, 2004, pp. 37.5-1.37.5.4.
Tiwari et al., "Straddle Gate Transistors: High Ion/Ioff Transistors at Short Gate Lengths", IBM Research Article, pp. 26-27 (pre-Mar. 2006).
Villaret et al., "Mechanisms of charge modulation in the floating body of triple-well nMOSFET capacitor-less DRAMs", vol. 72 (1-4), Elsevier Publishers B.V., Apr. 2004, pp. 434-439.
Wang et al., "Achieving Low junction capacitance on bulk SI MOSFET using SDOI process", Micron Technology, Inc., Jun. 2003; 12 pages.
Yasaitis et al., "A modular process for integrating thick polysilicon MEMS devices with submicron CMOS", Analog Devices. Pre-2004.
Yoshida et al., "A capacitorless 1T-DRAM Technology Using Gate-Induced Drain-Leakage (GIDL) Current for Low-Power and High-Speed . . . ", IEEE Transactions on Electron Devices, vol. 53, No. 4, pp. 692-697 (Apr. 2006).
Yoshida et al., "A design of a capacitorless 1T-DRAM cell using gate-induced drain leakage (GIDL) current for low-power and high-speed embedded memory", IEEE International Electron Devices Meeting, 2003, IEDM '03 Technical Digest, Dec. 8-10, 2003, pp. 37.6.1-37.6.4.

\* cited by examiner

SEMICONDUCTOR DEVICE COMPRISING A TRANSISTOR GATE HAVING MULTIPLE VERTICALLY ORIENTED SIDEWALLS

RELATED PATENT DATA

This patent resulted from a divisional application of U.S. patent application Ser. No. 13/398,491, filed Feb. 16, 2012, entitled "Semiconductor Device Comprising a Transistor Gate Having Multiple Vertically Oriented Sidewalls", naming Werner Juengling as inventor, which resulted from a continuation application of U.S. patent application Ser. No. 11/863,535, filed Sep. 28, 2007, entitled "Semiconductor Device Comprising a Transistor Gate Having Multiple Vertically Oriented Sidewalls", naming Werner Juengling as inventor, now U.S. Pat. No. 8,399,920, which resulted from a divisional application of U.S. patent application Ser. No. 11/177,850, filed Jul. 8, 2005, entitled "Semiconductor Device Comprising a Transistor Gate Having Multiple Vertically Oriented Sidewalls", naming Werner Juengling as inventor, now U.S. Pat. No. 7,282,401, the disclosures of which are incorporated by reference.

FIELD OF THE INVENTION

This invention relates to the field of semiconductor manufacture and, more particularly, to a method used in the formation of a recessed access device (RAD) transistor gate, and a structure for a RAD transistor gate.

BACKGROUND OF THE INVENTION

Manufacture of various semiconductor devices such as memory devices, logic devices, and microprocessors has the common goal of miniaturization. As feature sizes decrease, the electrical operation of the transistor becomes more difficult. One contributing factor to this difficulty is known as the "short channel effect" in which the width of the transistor channel becomes excessively small due to miniaturization. This may result in the transistor activating even though a threshold voltage ($V_t$) has not been applied to the gate.

One type of transistor which has been developed to overcome the short channel effect of a conventional transistor by forming a wider channel in the same horizontal space is referred to as a "recessed access device" or "RAD" transistor. One type of RAD transistor comprises a transistor gate (word line) which is partially formed within a trench in a semiconductor wafer. The channel region is formed along the entire surface of the trench which, in effect, provides a wider channel without increasing the lateral space required by the transistor.

Figure 1:
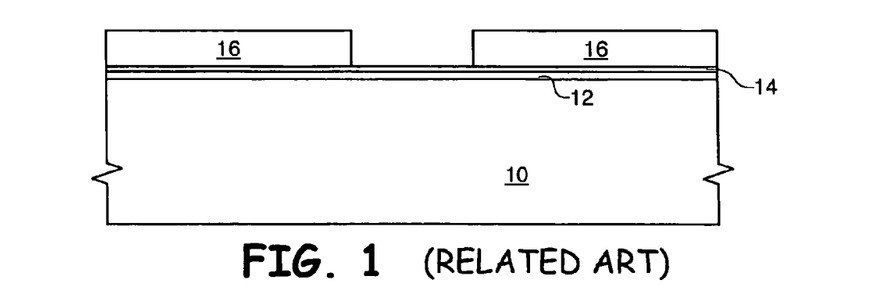
FIGS. 1-6 are cross sections depicting the conventional formation of a recessed access device (RAD) transistor.
Figure 2:
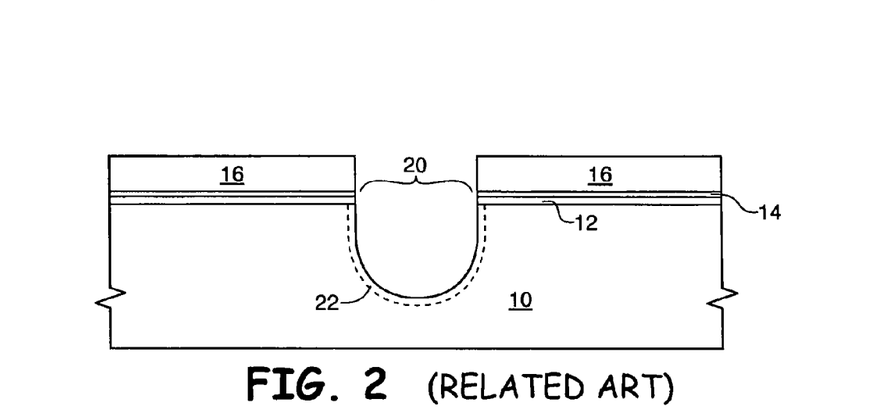

A conventional method to form an n-channel metal oxide semiconductor (NMOS) RAD transistor is depicted in FIGS. 1-6. FIG. 1 depicts a semiconductor wafer 10 having a region 12 which is doped with n-type dopants, a pad oxide (pad dielectric) 14 which protects the wafer 10 from a patterned mask 16, which is typically photoresist. An anisotropic etch is performed on the FIG. 1 structure to form the trench 20 within the wafer 10 as depicted in FIG. 2. The transistor channel 22 is formed within the wafer along the trench, and results from a conductively doped region within the wafer.

Figure 3:
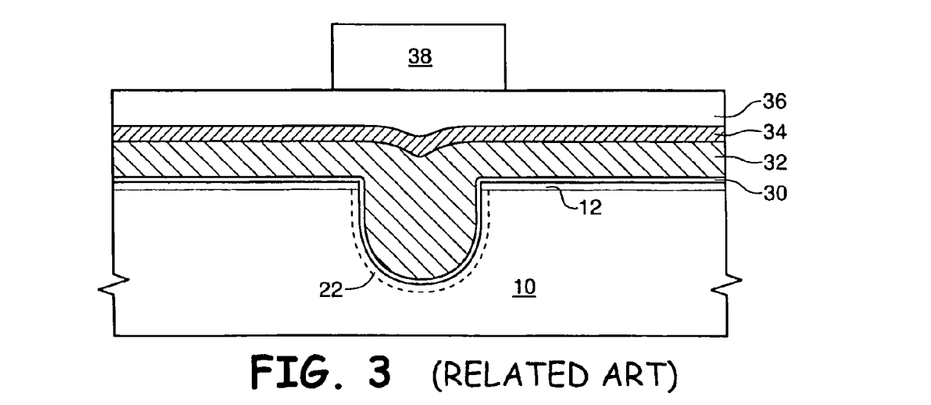
Figure 4:
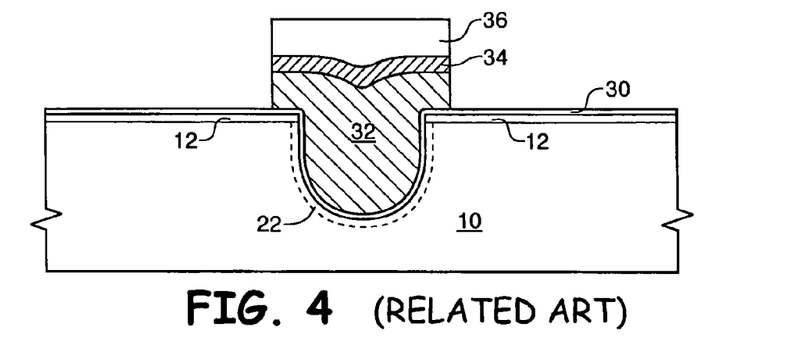
Figure 5:
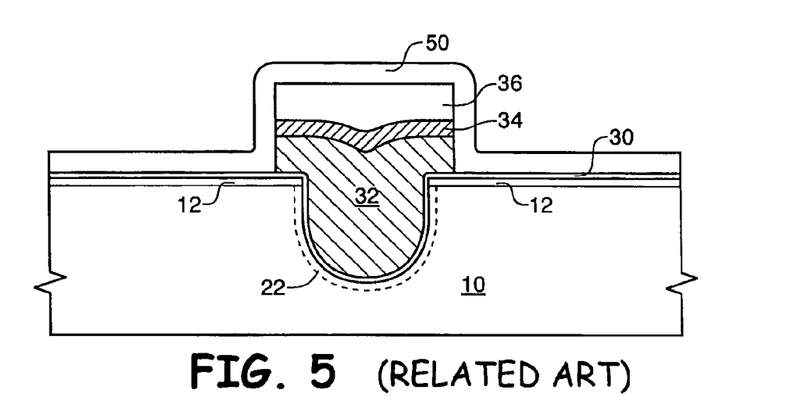
Figure 6:
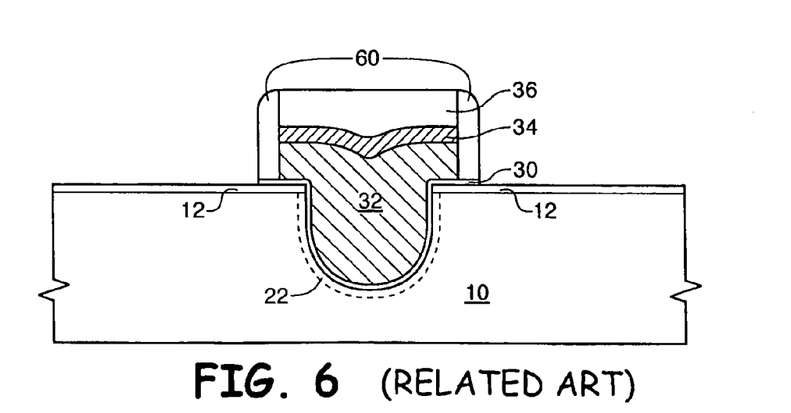

After forming the FIG. 2 structure, the photoresist 16 and the pad oxide 14 are removed and a transistor gate oxide layer 30 is formed over the exposed semiconductor wafer 10. Next, various blanket transistor gate layers are formed as depicted in FIG. 3, such as a doped polysilicon layer 32, a silicide layer 34, and a nitride capping layer 36. A patterned photoresist layer 38 is formed which will be used to define the transistor gate. The FIG. 3 structure is anisotropically etched down to the gate oxide, and the photoresist layer 38 is removed to result in the transistor gate of FIG. 4 which comprises layers 32, 34, and 36. A blanket spacer layer 50, for example silicon nitride, is formed over the structure of FIG. 4 to result in the FIG. 5 structure, and a spacer etch is then performed to form insulative spacers 60 around the transistor gate as depicted in FIG. 6, and to complete the transistor gate. In the structure of FIG. 6, implanted regions 12 represent transistor source/drain regions, although other implanting steps may be performed which are not immediately germane to the present invention.

Figure 7:
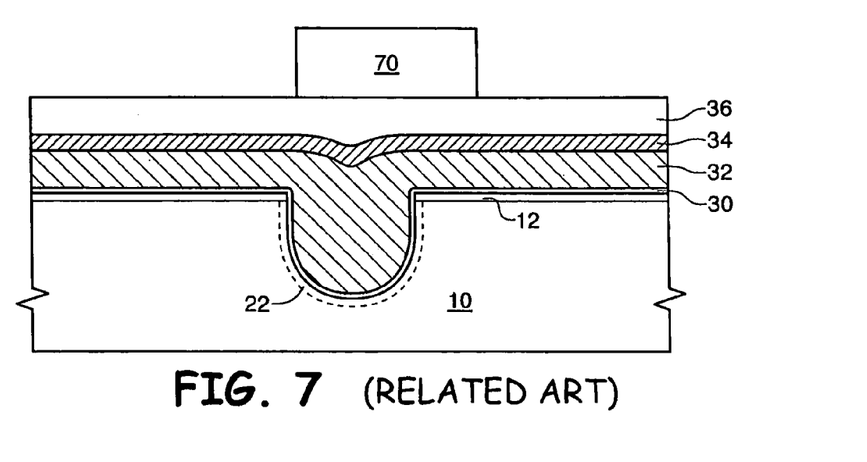
FIGS. 7-10 are cross sections depicting the conventional formation of a RAD transistor, wherein a misaligned mask is used to pattern the transistor gate stack.

The structure of FIGS. 1-6 is formed using an ideal process. A not-infrequent problem with semiconductor device formation, particularly with decreasing feature sizes, is misalignment of a photoresist mask. This may result in the process and structure depicted in FIGS. 7-10. FIG. 7 comprises a structure analogous to FIG. 3 wherein the mask 38 of FIG. 3 has been misaligned to result in mask 70 of FIG. 7.

Figure 8:
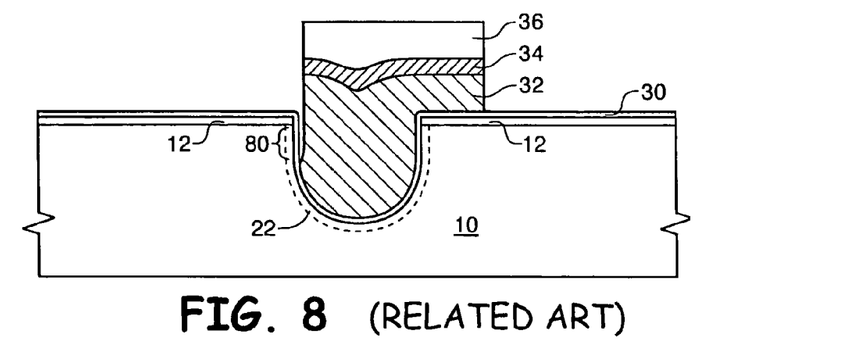

After forming the FIG. 7 structure, capping nitride layer 36, silicide layer 34, and polysilicon layer 32 are etched to result in the defined gate of FIG. 8. This etch, because of the misalignment of the mask 70, removes a portion of the polysilicon layer 32 from the trench along trench portion 80 and exposes the channel region 22 as depicted.

Figure 9:
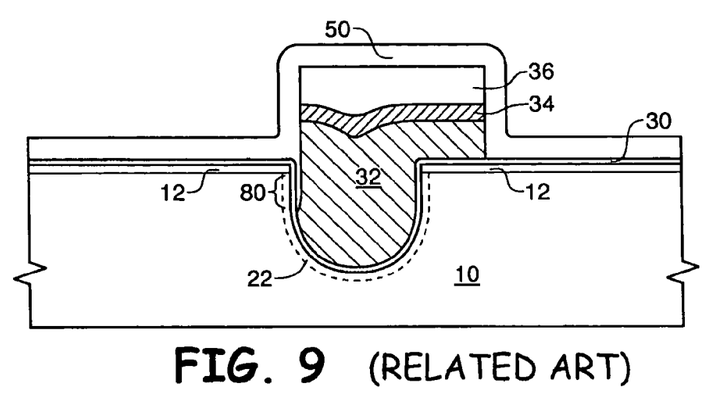
Figure 10:
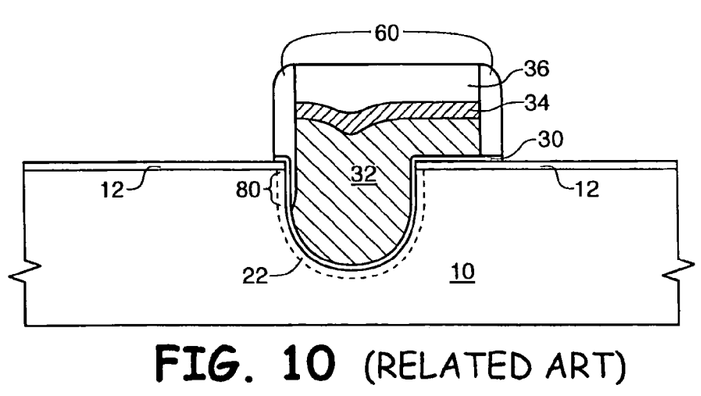

Wafer processing continues according to the method of FIGS. 1-6 to form spacer layer 50 as depicted in FIG. 9, then a spacer etch is performed to result the device of FIG. 10 comprising insulative spacers 60.

The transistor of FIG. 10 will have poor electrical operation and may even be nonfunctional. The application of the threshold voltage across the transistor requires adequate electrical communication between the gate (layers 32 and 34) and each of the channel region 22 and the source/drain regions 12. As depicted in FIG. 6, the gate overlies the entire channel region 22 and also the source/drain region 12 on each side of the channel 22. As depicted in FIG. 10, however, the gate 32, 34 does not overlie either of region 80 of the channel 22 or the source/drain region 12 on the left side of the gate. Further, the nitride spacer 60 has a portion interposed between gate layer 32 and region 80 of the channel 22. This electrical insulator between the gate and the channel, along with the increased distance between gate layer 32 and portion 80 of channel 22, decreases electrical coupling between the channel portion 80 and gate layer 32.

A method for forming a RAD transistor gate and a resulting RAD transistor which has more robust tolerance for mask misalignment over conventional processing would be desirable.

SUMMARY OF THE INVENTION

The present invention provides a new method which, among other advantages, reduces problems associated with the manufacture of semiconductor devices, particularly problems resulting from mask misalignment during the formation of a recessed access device (RAD) transistor. In accordance with one embodiment of the invention a pad oxide layer and a dielectric vertical spacing layer are formed over a semiconductor wafer substrate assembly comprising a semiconductor wafer, then a trench or opening is etched into the wafer through an opening in the vertical spacing layer. The wafer exposed at the trench is implanted to form a channel region, and a gate oxide is provided within the trench. Next, blanket gate layers, such as a doped polysilicon layer, a silicide layer, and a capping layer are formed, with at least the polysilicon layer formed partially within the trench, and all the gate layers formed over the vertical spacing layer.

Next, the capping layer, the silicide layer, and the polysilicon layer are masked with a patterned photoresist layer, which will be used to pattern the transistor gate. This embodiment of the present invention provides for additional misalignment tolerance of this mask, which defines the transistor gate. The exposed portions of the capping layer, the silicide layer, and the polysilicon layer are overetched just far enough to ensure removal of the polysilicon layer from over the vertical spacing layer. During this etch, a portion of the vertical spacing layer which is exposed is partially etched, and prevents removal of the polysilicon layer from within the trench.

An implant may be performed to adjust the source/drain regions. Subsequently, a blanket conformal spacer layer is formed over the transistor gate and over the vertical spacing layer, then a vertical etch is performed to expose the semiconductor wafer. Wafer processing then continues as is known in the art to complete the semiconductor device.

Advantages will become apparent to those skilled in the art from the following detailed description read in conjunction with the appended claims and the drawings attached hereto.

It should be emphasized that the drawings herein may not be to exact scale and are schematic representations. The drawings are not intended to portray the specific parameters, materials, particular uses, or the structural details of the invention, which can be determined by one of skill in the art by examination of the information herein.

DETAILED DESCRIPTION OF THE ILLUSTRATED EMBODIMENTS

The term "wafer" is to be understood as a semiconductor-based material including silicon, silicon-on-insulator (SOI) or silicon-on-sapphire (SOS) technology, doped and undoped semiconductors, epitaxial layers of silicon supported by a base semiconductor foundation, and other semiconductor structures. Furthermore, when reference is made to a "wafer" in the following description, previous process steps may have been utilized to form regions or junctions in or over the base semiconductor structure or foundation. Additionally, when reference is made to a "substrate assembly" in the following description, the substrate assembly may include a wafer with layers including dielectrics and conductors, and features such as transistors, formed thereover, depending on the particular stage of processing. In addition, the semiconductor need not be silicon-based, but may be based on silicon-germanium, silicon-on-insulator, silicon-on-sapphire, germanium, or gallium arsenide, among others. Further, in the discussion and claims herein, the term "on" used with respect to two layers, one "on" the other, means at least some contact between the layers, while "over" means the layers are in close proximity, but possibly with one or more additional intervening layers such that contact is possible but not required. Neither "on" nor "over" implies any directionality as used herein.

Figure 11:
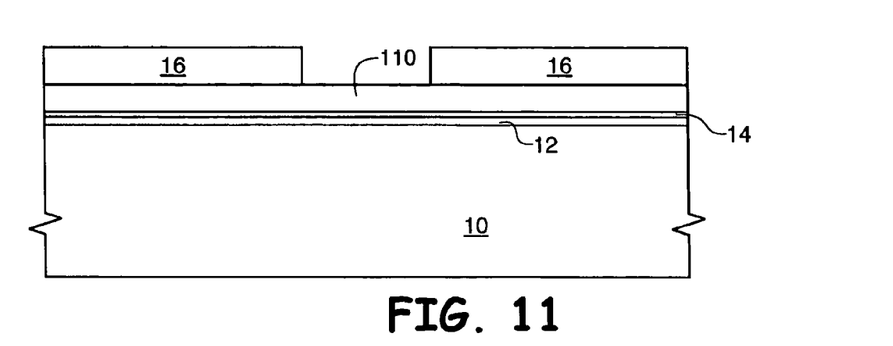
FIGS. 11-16 are cross sections depicting an embodiment of the present invention used to form a RAD transistor, wherein a misaligned mask is used to pattern the transistor gate stack.

A first embodiment of an inventive method used to form a recessed access device (RAD) transistor is depicted in FIGS. 11-16. FIG. 11 depicts a semiconductor wafer 10 having a region 12 comprising n-type dopants. FIG. 11 further depicts pad oxide (pad dielectric) 14 which protects against contamination, provides stress relief between the wafer 10 and the vertical spacing layer 110, and functions as an etch stop layer during an etch of vertical spacing layer 110. The vertical spacing layer 110 may comprise any dielectric such as, by way of example only, silicon dioxide or silicon nitride. With present device sizes, the vertical spacing layer will be between about 100 Å and about 500 Å thick, and its thickness will depend on the gate overetch (polysilicon overetch). FIG. 11 further depicts a patterned mask 16, such as photoresist, which is used to define a trench in wafer 10. After forming the FIG. 11 structure, an anisotropic etch is performed to form a trench 20 within the wafer 10, then the mask layer 16 is removed to result in the structure of FIG. 12. A conductively doped channel region 22 may result from previous ion implantation into the wafer, or the wafer along the trench may be implanted subsequent to trench formation.

Figure 12:
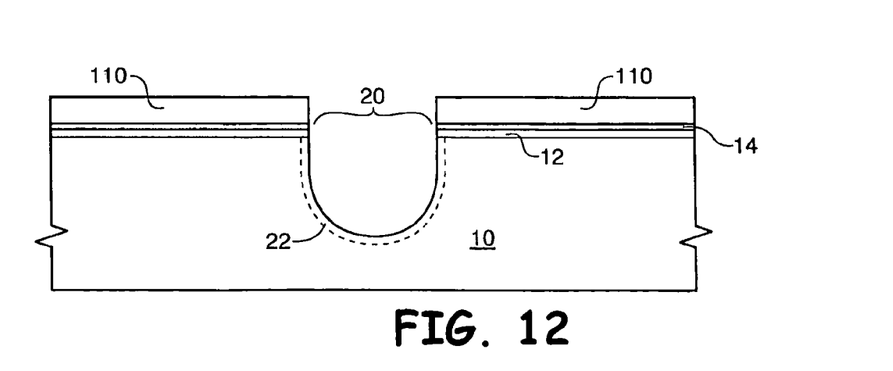
Figure 13:
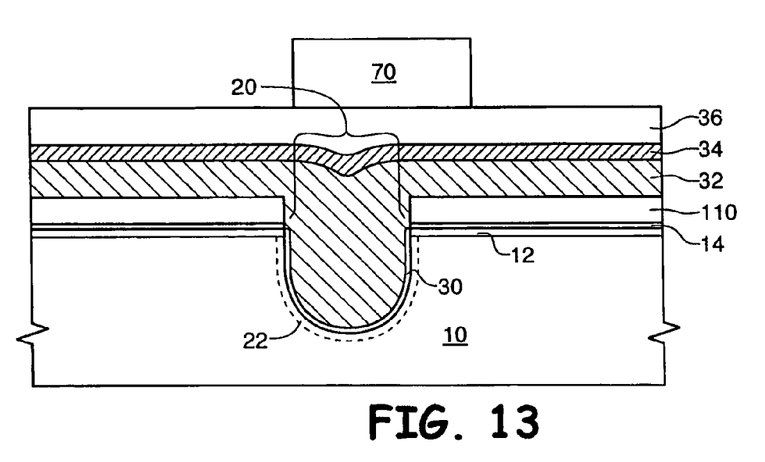

After forming the FIG. 12 structure, a transistor gate oxide layer is grown on the exposed semiconductor wafer according to techniques known in the art to result in the gate oxide 30 of FIG. 13. Next, various blanket transistor gate layers are formed, such as a doped polysilicon layer 32, a silicide layer 34, and a nitride capping layer 36. A patterned photoresist layer 70 is formed which will be used to define the transistor gate. While mask 70 is intended to be centered over the trench 20, mask 70 has been misaligned due to variations in the masking process.

Figure 14:
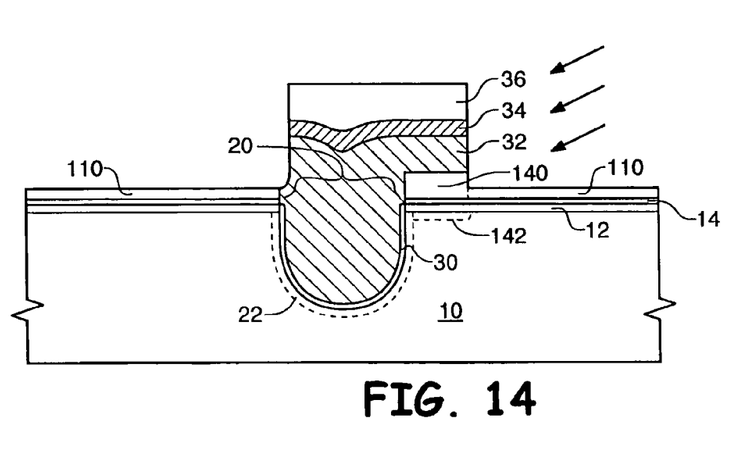
Figure 15:
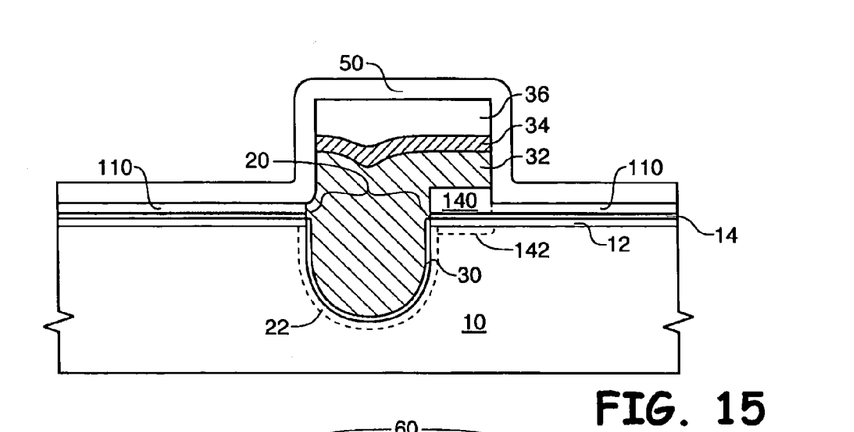

The FIG. 13 structure is anisotropically etched to remove all exposed gate layers down to the vertical spacing layer 110, then the mask 70 is removed to result in the FIG. 14 structure. The etch of the FIG. 13 structure is preferably performed using an etch which removes polysilicon 32 and vertical spacing layer 110 at about the same rate. For a vertical spacing layer 110 formed from either silicon dioxide or silicon nitride, an etchant comprising tetrafluoromethane ($CF_4$) would result in sufficiently similar etch rates for the vertical spacing layer and the polysilicon gate layer. After completing the FIG. 14 structure, an implant is typically performed to enhance the source/drain regions 12.

The FIG. 14 structure also depicts the results of an intentional overetch of the polysilicon layer 32. This overetch partially etches the exposed portions of the vertical spacing layer, and ensures complete removal of the polysilicon layer 32 from over the vertical spacing layer 110. However, it is preferable that the overetch is terminated prior to etching completely through vertical spacing layer 110 so that none of polysilicon layer 32 is removed from within the trench 20 in the wafer 10. In this embodiment, an unetched portion 140 of layer 110 remains.

After forming the FIG. 14 structure, an optional angled implant (depicted by the arrows) into the semiconductor wafer 10 may be performed as depicted to more heavily dope the wafer, particularly into the wafer 10 at location 142 which is immediately under the unetched vertical spacing layer portion 140 which is interposed between the trench and the sidewall on the right-hand side of the transistor of FIG. 14. Implanting this region may be advantageous for electrical operation of the transistor if the mask 70 at FIG. 13 has been misaligned to such an excessive degree that the original wafer doping 12 at FIG. 11 does not provide sufficient electrical communication between the source/drain region 12 and the channel 22.

If the mask is not misaligned, an unetched portion of the vertical spacing layer similar to portion 140 will remain under each side of conductive transistor gate layer 32. That is, an unetched portion 140 of vertical spacing layer 110 will remain interposed between the trench and each vertically oriented transistor gate sidewall. In the FIG. 14 structure where mask misalignment has occurred, no unetched portion of vertical spacing layer 110 remains interposed between the trench and the transistor sidewall on the left side of the transistor gate as depicted.

Figure 16:
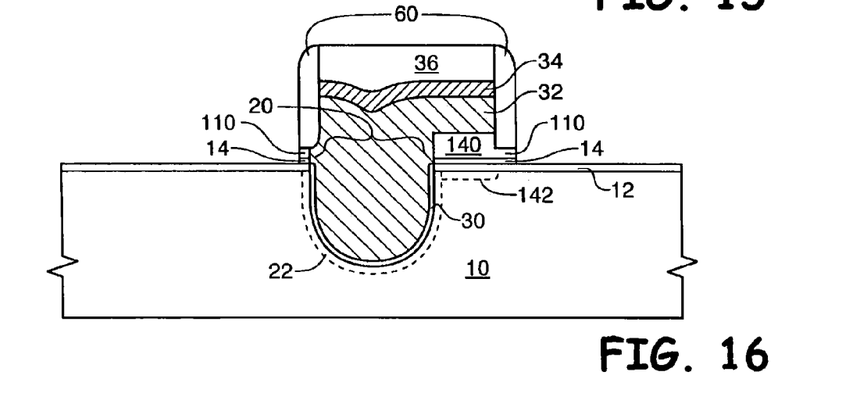

After completing the slight overetch of the gate to expose and etch into vertical spacing layer 110, vertically doping the source/drain regions, and completing any desired angled implants, a blanket spacer layer 50, for example silicon nitride, is formed over vertically oriented sidewalls of the conductive transistor gate layers 32, 34. Blanket spacer layer 50 is also formed over a horizontally oriented surface of the vertical spacing layer 110 of FIG. 14 to result in the FIG. 15 structure. Next, a spacer etch is performed to provide insulative spacers 60 around the conductive layers 32, 34 and the nonconductive layer 36 of the transistor gate as depicted in FIG. 16 to complete the transistor gate and the insulation layers surrounding the transistor gate. Wafer processing then continues according to techniques known in the art to form a completed semiconductor device.

By comparing FIG. 16 with FIG. 10, it may be easily determined that the inventive process results in a complete fill of the trench with the polysilicon layer 32, even in the case where the mask which defines the transistor gate stack is inadvertently misaligned to such an extent that one of the vertical edges of the mask overlies the trench. In contrast, conventional processing as depicted in FIG. 10 results in removal of a portion of the polysilicon layer 32 from the trench. This removal exposes the channel region 22 and also results in the formation of the dielectric spacer material 60 within the trench 20 in the wafer 10. When the channel 22 is exposed during conventional processing with a misaligned mask, the missing portion of the gate electrode results in decreased electrical interaction between the gate and the channel. This decreased interaction may result in a higher threshold voltage for the transistor, and may prevent the transistor from activating during the application of $V_t$. The etch of the gate polysilicon 32 and subsequent formation of the dielectric layer 60 within the trench 20 as depicted in FIG. 10 effectively results in a thicker gate oxide at this location because the distance from the polysilicon layer 32 to the channel 22 is increased. This results in decreased electrical interaction between the gate layer 32 and the channel 22 at this location. This problem with conventional processing may be overcome by the present invention, as may be determined by reviewing the FIG. 16 structure which has been formed using an embodiment of the present invention with a misaligned mask.

The FIG. 16 structure comprises a recess 20 in the semiconductor wafer 10, with the recess filled with a transistor gate conductor 32 which, in the present embodiment, is doped polysilicon. A silicide layer 34 overlies the gate conductor 32, and a capping layer 36 overlies the silicide 34. FIG. 16 further depicts first and second cross sectional spacers 60 which, in the present embodiment, may comprise silicon nitride. Interposed between each spacer 60 and the wafer 10 is a portion of the vertical spacing layer 110 and the pad oxide 14.

The FIG. 16 structure also comprises, at the right-hand side of the transistor, an unetched portion 140 of the vertical spacing layer 110 which is interposed between the transistor gate conductor 32 and the semiconductor wafer 10. Further, a portion of the pad oxide 14 is interposed between unetched portion 140 of the vertical spacing layer 110 and the semiconductor wafer 10. As depicted, the left-hand side of the transistor does not comprise an unetched portion of the vertical spacing layer 110, but instead comprises only an etched portion of the vertical spacing layer. Both an etched portion of the vertical spacing layer and a portion of the pad oxide are interposed between the dielectric spacer 60 and the wafer 10 on the left-hand side of the FIG. 16 transistor.

On the left half of the misaligned transistor as depicted in FIG. 16, a vertically oriented edge of the polysilicon gate layer 32 overlies the trench, whereas on the depicted right half of the transistor the vertically oriented edge of the polysilicon gate layer 32 does not overlie the trench. The vertically oriented left edge extends below a horizontal upper surface (but does not extend below a horizontal lower surface) of the unetched portion 140 of layer 110, and thus does not extend into the trench formed in the wafer. As also depicted in FIG. 16, after etching the spacer layer 50 of FIG. 15 to complete the transistor and surrounding dielectric, a portion of the vertical spacing layer 110 on each side of the gate is exposed, as is a portion of the pad oxide layer 14.

Figure 17:
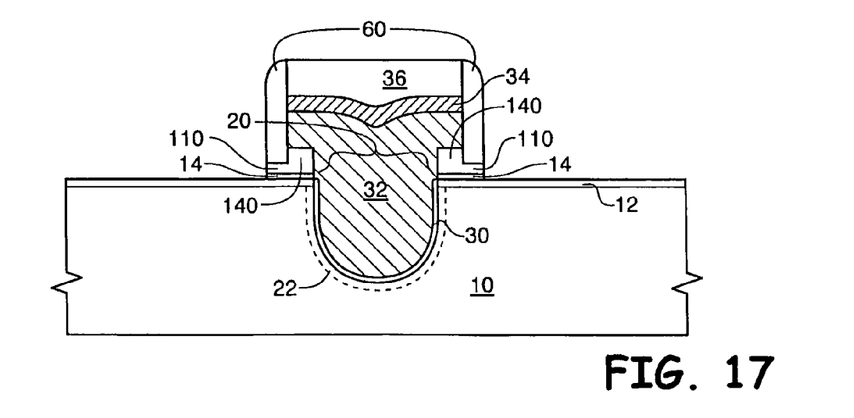
FIG. 17 is a cross section of an embodiment of the present invention used to form a RAD transistor, wherein a properly aligned mask is used to pattern the transistor gate stack.

FIG. 17 depicts an embodiment of the invention wherein a properly aligned mask has been used to define the transistor gate stack. As depicted, an unetched portion 140 of the vertical spacing layer 110 remains interposed between the trench in the wafer 10 and each of the vertically oriented sidewalls of the transistor gate stack at an oblique angle. These unetched segments 140 of the vertical spacing layer 110 are also interposed in a vertical direction between conductive transistor gate layer 32 and the semiconductor wafer 10 at a location on both sides of the trench. Further, transistor gate 32 is interposed between the two segments of layer 140 in this embodiment. Because the mask is properly aligned, neither of the cross sectional sidewalls in the mask which forms the transistor gate stack overlies the trench.

Figure 18:
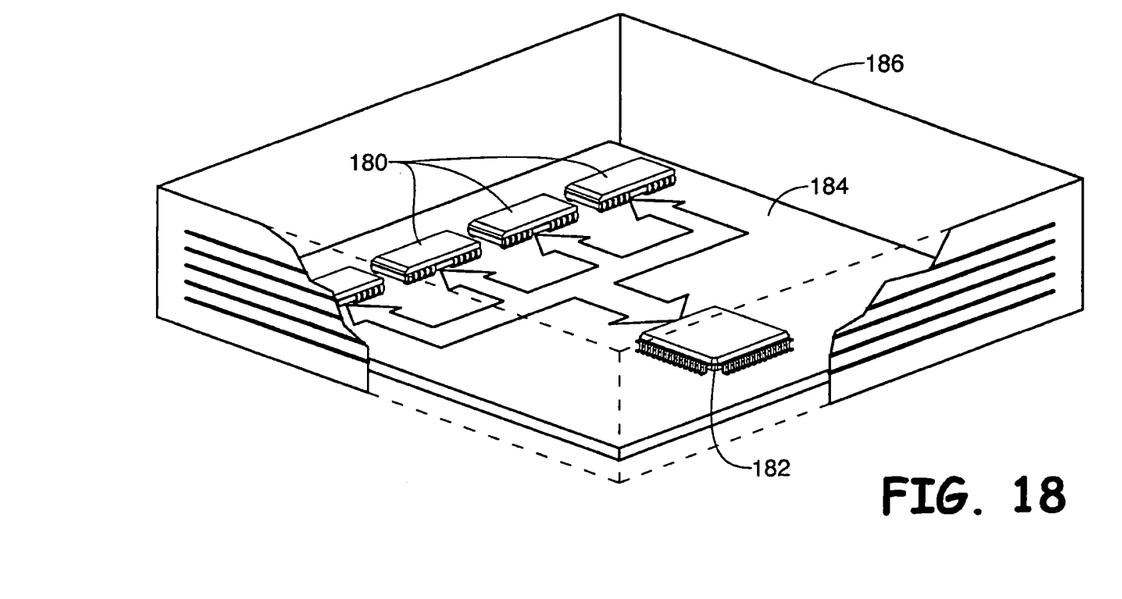
FIG. 18 is an isometric depiction of various components which may be manufactured using devices formed with an embodiment of the present invention.

As depicted in FIG. 18, a semiconductor device 180 formed in accordance with the invention may be attached along with other devices such as a microprocessor 182 to a printed circuit board 184, for example to a computer motherboard or as a part of a memory module used in a personal computer, a minicomputer, or a mainframe 186. FIG. 18 may also represent use of device 180 in other electronic devices comprising a housing 186, for example devices comprising a microprocessor 182, related to telecommunications, the automobile industry, semiconductor test and manufacturing equipment, consumer electronics, or virtually any piece of consumer or industrial electronic equipment.

Figure 19:
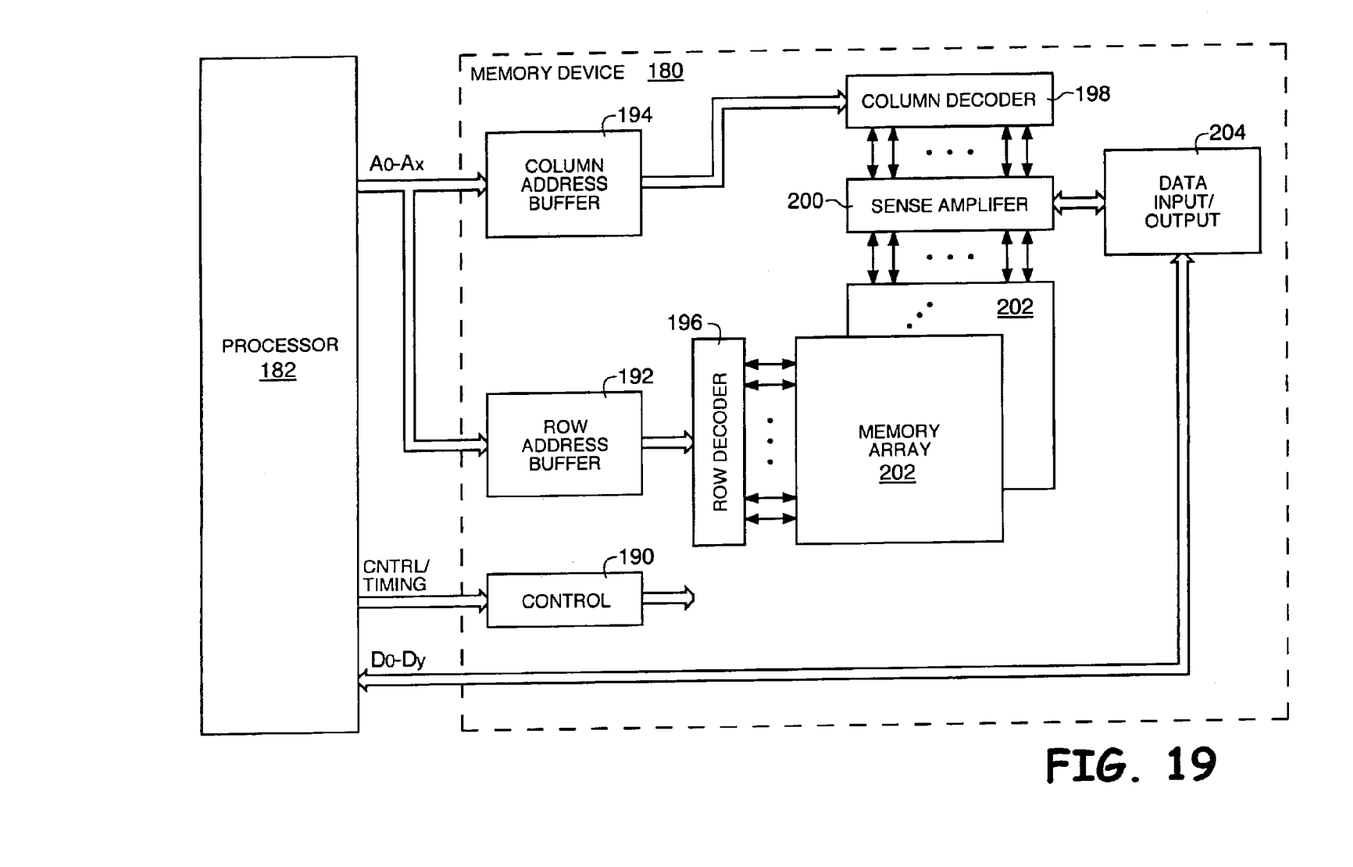
FIG. 19 is a block diagram of an exemplary use of the invention to form part of a memory device having a storage transistor array.

The process described herein can be used to manufacture a semiconductor device comprising one or more types of memory array transistors and/or periphery transistors formed using the inventive process. FIG. 19, for example, is a simplified block diagram of a memory device such as a dynamic random access memory having word lines formed using an embodiment of the present invention. The general operation of such a device is known to one skilled in the art. FIG. 19 depicts a processor 182 coupled to a memory device 180, and further depicts the following basic sections of a memory integrated circuit: control circuitry 190; row 192 and column 194 address buffers; row 196 and column 198 decoders; sense amplifiers 200; memory array 202; and data input/output 204.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. It is therefore contemplated that the appended claims will cover any such modifications or embodiments as fall within the true scope of the invention.

What is claimed is:

1. A semiconductor device comprising:
    a transistor comprising a conductive gate within and projecting elevationally outward of a trench in semiconductive material;
    a gate dielectric within the trench between the conductive gate and the semiconductive material;
    the conductive gate comprising opposing laterally outermost vertically oriented conductive gate sidewalls that are elevationally outward of the semiconductive material laterally outward of semiconductive material sidewalls of the trench, "elevationally" and "laterally" being with respect to two different directions that are perpendicular relative to one another, the gate comprising opposing laterally inner vertically oriented conductive gate sidewalls elevationally outward of the semiconductive material;
    a dielectric spacer along each of the laterally outermost vertical gate sidewalls; and
    a dielectric vertical spacing layer elevationally inward of the laterally outermost vertical gate sidewall on each of opposing sides of the gate, the vertical spacing layer extending laterally outward and laterally inward relative to the laterally outermost vertical gate sidewall on each of the opposing sides of the conductive gates, at least one of the dielectric vertical spacing layers on one of the opposing sides of the gate having a first portion that is under the gate and above the semiconductive material on that one opposing gate side and having a second portion that is under the spacer and above the semiconductive material on that one opposing gate side, the first portion that is under the gate being elevationally thicker than the second portion that is under the spacer, the first portion having a laterally outer sidewall on that one opposing gate side, the dielectric spacer on that one opposing gate side being directly against the first portion laterally outer sidewall on that one opposing gate side, no part of the second portion on that one opposing gate side being directly against the conductive gate.

2. The device of claim 1 comprising a pad dielectric elevationally between the dielectric vertical spacing layer and the semiconductive material on each of the opposing sides of the conductive gate.

3. A semiconductor device comprising:
    a transistor comprising a conductive gate within and projecting elevationally outward of a trench in semiconductive material;
    a gate dielectric within the trench between the conductive gate and the semiconductive material;
    the conductive gate comprising opposing laterally outermost vertically oriented conductive gate sidewalls that are elevationally outward of the semiconductive material laterally outward of semiconductive material sidewalls of the trench, "elevationally" and "laterally" being with respect to two different directions that are perpendicular relative to one another, the gate comprising opposing laterally inner vertically oriented conductive gate sidewalls elevationally outward of the semiconductive material;
    a dielectric spacer along each of the laterally outermost vertical gate sidewalls; and
    a dielectric vertical spacing layer elevationally inward of the laterally outermost vertical gate sidewall on each of opposing sides of the gate, the vertical spacing layer extending laterally outward and laterally inward relative to the laterally outermost vertical gate sidewall on each of the opposing sides of the conductive gates, the dielectric vertical spacing layers on each of the opposing sides of the gate having a first portion that is under the gate and above the semiconductive material and having a second portion that is under the spacer and above the semiconductive material, the first portion that is under the gate being elevationally thicker than the second portion that is under the spacer on each of the opposing gate sides, the first portion having a laterally outer sidewall on each of the opposing gate sides, the dielectric spacer on each of the opposing gate sides being directly against the first portion laterally outer sidewall on each of the opposing gate sides, no part of the second portion on each of the opposing gate sides being directly against the conductive gate.

* * * * *